United States Patent [19]

Murase et al.

[11] Patent Number: 5,051,688

[45] Date of Patent: Sep. 24, 1991

[54] CROSSED COIL METER DRIVING DEVICE HAVING A PLURALITY OF INPUT PARAMETERS

[75] Inventors: Hiroshi Murase, Kyoto; Keizi Ishizuka, Omiya; Masakazu Kobayashi, Omiya; Masanori Narita, Omiya, all of Japan

[73] Assignees: Rohm Co., Ltd., Kyoto; Kanto Seiki Co., Ltd., Saitama, both of Japan

[21] Appl. No.: 625,927

[22] Filed: Dec. 11, 1990

[30] Foreign Application Priority Data

Dec. 20, 1989 [JP] Japan .................................. 1-332280
Dec. 20, 1989 [JP] Japan .................................. 1-332281
Dec. 20, 1989 [JP] Japan .................................. 1-332282

[51] Int. Cl.$^5$ .......................... G01R 11/36; G01P 3/48
[52] U.S. Cl. ................................. 324/143; 324/140 R; 324/160; 324/167
[58] Field of Search .............. 324/140 R, 140 D, 143, 324/144, 146, 147, 151 R, 151 A, 154 R, 160, 166, 167, 115, 111

[56] References Cited

U.S. PATENT DOCUMENTS

4,827,209  5/1989  Tanaka et al. ...................... 324/143
4,928,060  5/1990  Ito ..................................... 324/143

Primary Examiner—Kenneth A. Wieder
Assistant Examiner—W. S. Edmonds
Attorney, Agent, or Firm—Oliff & Berridge

[57] ABSTRACT

A meter driving device for indicating angular positions corresponding to input values. The device includes a memory for storing previously given input values, angular directions corresponding to the input values, and coefficients representative of the grades of change in angular direction depending on the change between adjacent two input values, as parameters. Based on these parameters and the frequency of input pulse signal giving the input values, the angular direction corresponding thereto is calculated. The angular direction signal receives PWM process and then supplies to a pair of crossed exciting coils via a driver. During a predetermined time period from the turning ON and OFF of the power source, the transference of the angular direction signals to the driver is shut out by logic gates, thereby inhibiting malfunctional meter indication.

6 Claims, 6 Drawing Sheets

CROSSED COIL METER DRIVING DEVICE HAVING A PLURALITY OF INPUT PARAMETERS

BACKGROUND OF THE INVENTION

1. Field of the Invention

This invention relates to a meter driving device, and more particularly to a device for driving a cross coil meter which indicates, upon energization on a pair of crossed exciting coils, angular directions corresponding to input values.

2. Description of the Related Art

Heretofore, a cross coil meter for indicating angular directions corresponding to input values has been well known. The indication is made by applying, to a rotatably supported magnet, a torque originated from magnetic field which is generated by supplying electric currents corresponding to the input value to a pair of crossed exciting coils. Such cross coil meter is for use in, for example, speed meter, tachometer, fuel meter or oil pressure indicator of automobiles and the like.

Figure 5:
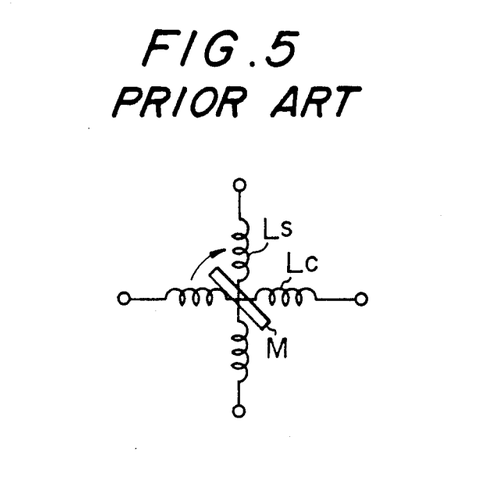
FIGS. 5 through 7 are schematic views and a diagram for a conventional meter driving device.
Figure 6:
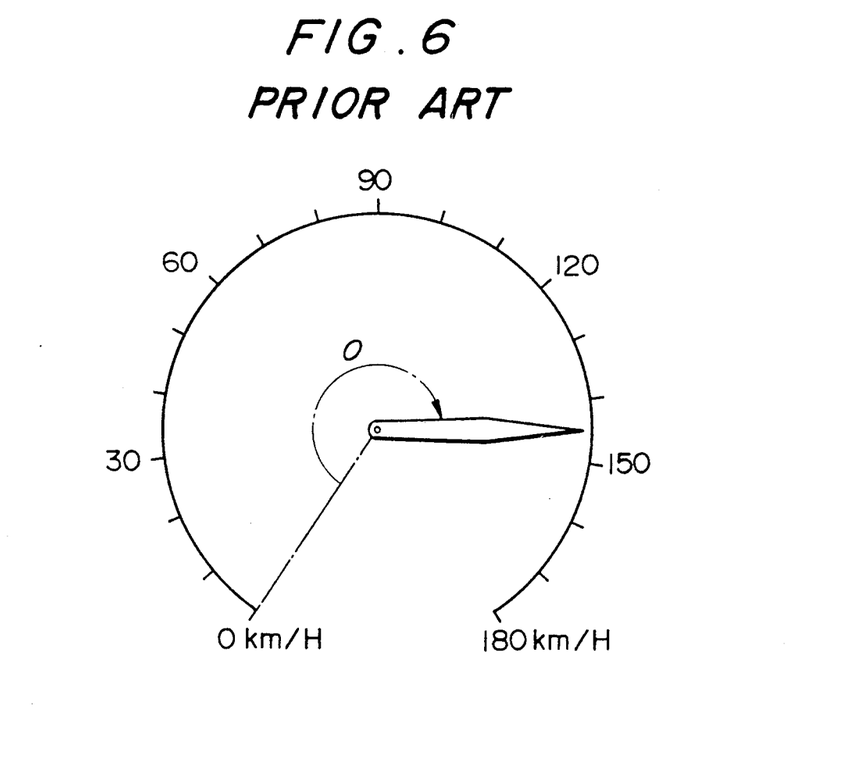

FIGS. 5 and 6 of the accompanying drawings show schematic views of such a cross coil meter. A pair of exciting coils Ls and Lc which are arranged orthogonally to each other generate a magnetic field in a desired angular direction upon supplied electric currents corresponding to the input value, like of the speed. A rotatably supported permanent magnet M then receives a torque originated from the magnetic field generated at the two exciting coils Ls, Lc. As a result, a pointer fixed on the permanent magnet M goes rotating for an angle corresponding to the input value as shown in FIG. 6, thereby indicating a predetermined position of an indication plate on which a physical quantity (=speed in case of FIG. 6) to be measured is scaled.

A device for driving such a cross coil meter used as speed meter and fuel meter of automobiles etc., is generally composed: to input pulse signals, the frequency of which fluctuates depending on the input value e.g. of speed; also to input basic clock signals generated by a clock generating means; and then to count one cycle of the pulse signal using the pulses of the basic clock signals thereby obtaining the frequency of the input value.

Figure 7:
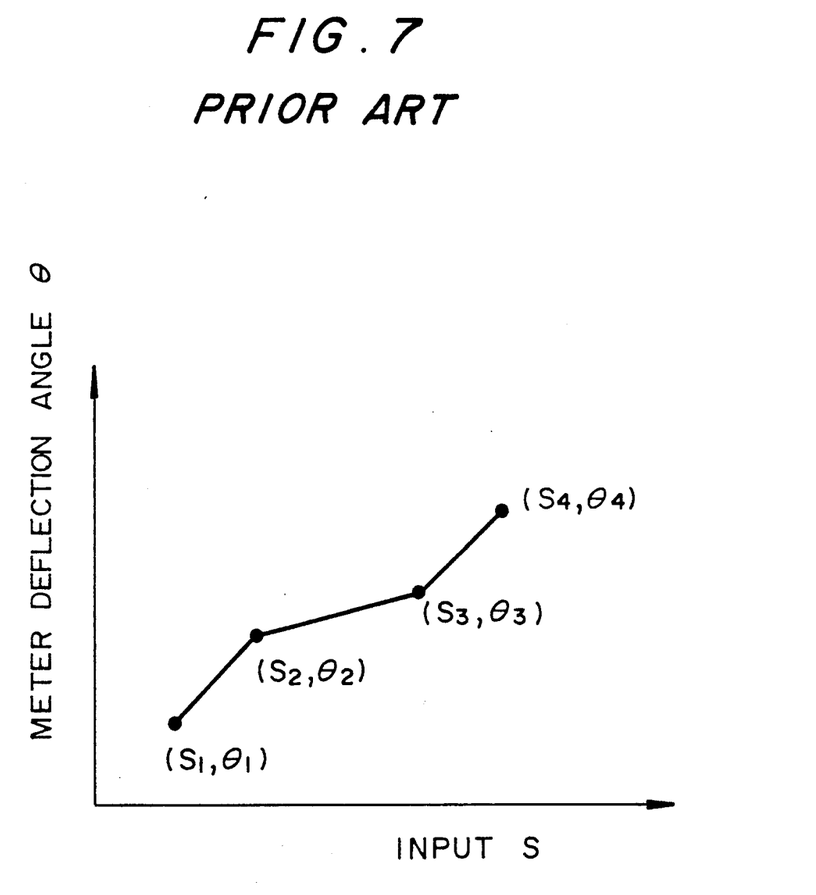

Electric currents corresponding to the calculated frequency are modulated by PWM (pulse width modulation) and supplied to the crossed exciting coils Ls, Lc via a driver. For supplying currents corresponding to the frequency of the input pulse signal, pointer rotating angles for a several input values S are predviously determined, and these values (S, $\theta$) are previously stored in a E$^2$PROM being a ROM capable of electrically erasing and writing data. For instance, as shown in FIG. 7, four pointer rotation angles $\theta 1$, $\theta 2$, $\theta 3$ and $\theta 4$ corresponding to input values S1, S2, S3 and S4 are stored as parameters in E$^2$PROM. To obtain each rotating angle $\theta$ for indicating the position corresponding to the input value S, the parameters are read out of the E$^2$PROM and the following calculation is executed:

$$\theta = \theta n + (\theta n + 1 - \theta n)/(Sn + 1 - Sn)*(S - Sn) \quad \ldots (1)$$

where n = 1, 2, 3, 4.

Thereafter a predetermined process is performed in accordance with the obtained $\theta$ in order to supply currents to the coils Ls, Lc.

In this manner, it is possible to drive a variety of meters by a single driving device, by storing rotating angles $\theta$ for the predetermined input values S in the E$^2$PROM and calculating rotating angles corresponding to the input values to be indicated, and by using the stored data. Namely, due to the difference in indication system of meters depending on the types of automobiles etc., it had been required to prepare different driving systems for driving the meters. In this regard, by adopting E$^2$PROM, the driving system can deal with such differences only by suitably rewriting the data (S, $\theta$) being stored therein.

But such a conventional meter driving device must use the formula (1) to obtain pointer rotating angle $\theta$ corresponding to the input value S, resulting in complicated calculation program. That is, it has been necessary to incorporate the program for division calculation $(\theta n + 1 - \theta n)/(Sn + 1 - Sn)$ as shown in the formula (1) into an IC of the driving device, and this brings increased number of ROMs to complicate process steps.

In addition, on driving a cross coil meter, the exciting coils are energized based on the cycle of an input pulse signal from a speed sensor or a revolution sensor detected by counting the number of pulses of a basic clock signal having a predetermined basic frequency (e.g. 2 MHz). However, since the maximum frequency i.e. minimum period of an input signal to be detected differs depending on the types of automobiles, there has been a disadvantage that the number of bits in the counter for counting the number of the basic clock signal pulses extensively increases.

Now, it is assumed that the maximum frequencies of the inputted pulse signals for the period detection mutually differ as 250 Hz, 500 Hz, 1 KHz and 2 Kz depending on the types of automobiles incorporating the meter. On counting the cycle of the input pulse signal by means of basic clock signals for restricting the cycle detection error accompanying with the quantization error arising at that counting to a predetermined value (normally below 1/1000), the number of basic clock pulses becomes necessary to be more than one thousand. Specifically, when the maximum input frequency is expressed as fmax, the basic clock frequency must be set at over 1000 fmax, so when fmax equals to 2 KHz, over 2 MHz.

When the frequency of the basic clock signal is 2 MHz, then, the counter for counting the number of pulses of this clock signal must judge whether the input frequency is 0 Hz or 2 Hz at the indication resolution of 1/1000. If the judging line is established at 1 Hz, the pulse number to be counted will be 2,000,000 requiring a counter of 21 bits.

However, at counting the cycle of the input pulse signal with basic clock signals having a predetermined frequency of 2 MHz, a counter of 21 bits suffices for an input signal having a maximum frequency of 2 KHz, but for an input signal having a maximum frequency of 1 KHz, a counter of 22 bits will be required because of the cycle increasing twice that of 2 KHz signal. Moreover, for an input signal having a maximum frequency of 500 Hz, a quadruple i.e. 23 bits-counter, and further for an input signal having a maximum frequency of 250 Hz, an eight-fold i.e. 24 bits-counter must be provided respectively.

Of course, the accuracy enhances proportionally to the increase of the number of bits. Nevertheless, since the angular direction to be indicated has significant relationship to the fixed resolution property of the meter, it is neither practical nor effective to enhance the accuracy recklessly.

Furthermore, in the conventional meter driving device, it has been disadvantageous that the indication corresponding to the input value could not be performed accurately in particular at the time of turning ON or OFF of the power source in the driver, since the meter has been driven by directly supplying PWM-modulated currents to the driver.

The cause of this disadvantage; when the automobile ignition switch is in OFF state, the driver is generally also in OFF state and receives no voltage for avoiding its unnecessary large power consumption upon supplied currents due to its analog system. When the ignition switch and the power source are turned ON, the voltage of the driver builds-up to be ready to function. However, in this initial state, the processing data is unsettled yet. So the energizing of the exciting coils by the driver based on such indefinite value would cause inaccurate indication of the meter not corresponding to the input value.

Likewise, at the OFF state of the power source in the driver, the driver can not act correctly because of the lowering of the voltage below the operating voltage, thereby causing abnormal meter operation.

SUMMARY OF THE INVENTION

It is therefore an object of this invention to provide a meter driving device which is capable of reliably indicating angular positions corresponding to input values with a simplified processing system of the input pulse signals, and capable of versatilely processing a variety of input pulse signals having different frequencies.

Another object of this invention is to provide a meter driving device which is capable of avoiding abnormal indication at the time of turning ON and OFF of the power source, thereby rendering high reliability.

According to this invention, there is provided a meter driving device, comprising: a clock generating means for generating basic clock signals; a frequency calculating means for calculating an input pulse signal frequency which serves to provide the input value for indicating the angular direction; a memory means for memorizing as parameters a plurality of input values Sm (m=1, 2, ...), angular directions θm corresponding to the input values Sm, and coefficients Rm representative of the grades of the change in angular direction depending on the change between adjacent two input values Sm and Sm+1 among the plurality of input values; a calculating means for calculating the angular direction corresponding to the input value based on the input pulse signal frequency obtained by said frequency calculating means and on the parameters read out from said memory means, and for outputting an angular direction signal; a driving means having a power source and for energizing a first and a second mutually crossed exciting coils based on the outputted angular direction signal.

Namely, the angular direction can be calculated by the following formula without requiring any division process:

$$\theta = \theta m + Rm*(S - Sm) \qquad \ldots (2)$$

where Sm: an input value; θm: an angular direction corresponding to the Sm; Rm: a coefficient for the grade of change; S: input pulse signal frequency.

The frequency calculating means includes a frequency divider for dividing the basic clock signal at a frequency-division rate corresponding to the minimum cycle of the input pulse signal, and counts the number of the divided basic clock signal pulses per one cycle of the input pulse signal so as to detect the frequency of the input pulse signal.

Specifically, when the basic clock signal frequency used for counting the cycle of the input pulse signal having a minimum cycle Tmin is designated as "fref", the frequency divider divides the basic clock signal frequency by 2 i.e. fref/2 for according the counting accuracy, in order to count the cycle of an input pulse having a minimum cycle of 2Tmin.

The driving means PWM-modulates the angular direction signal and amplifies this by means of two drivers which then energize the pair of crossed exciting coils so as to indicate the angular direction corresponding to the input value.

Further, when a predetermined time period has passed from the time of turning ON or OFF of the power source in the driving means, a output control means outputs an indication-authorizing signal or an indication-inhibiting signal respectively, and only when the indication-authorizing signal is outputted, a logical gate means supplies the angular direction signal to the driving means for the indication.

The above and other advantages, features and additional objects of this invention will be manifest to those versed in the art upon making reference to the following detailed description and the accompanying drawings in which two preferred structural embodiments incorporating the principles of this invention are shown by way of illustrative example.

DETAILED DESCRIPTION

Figure 1:
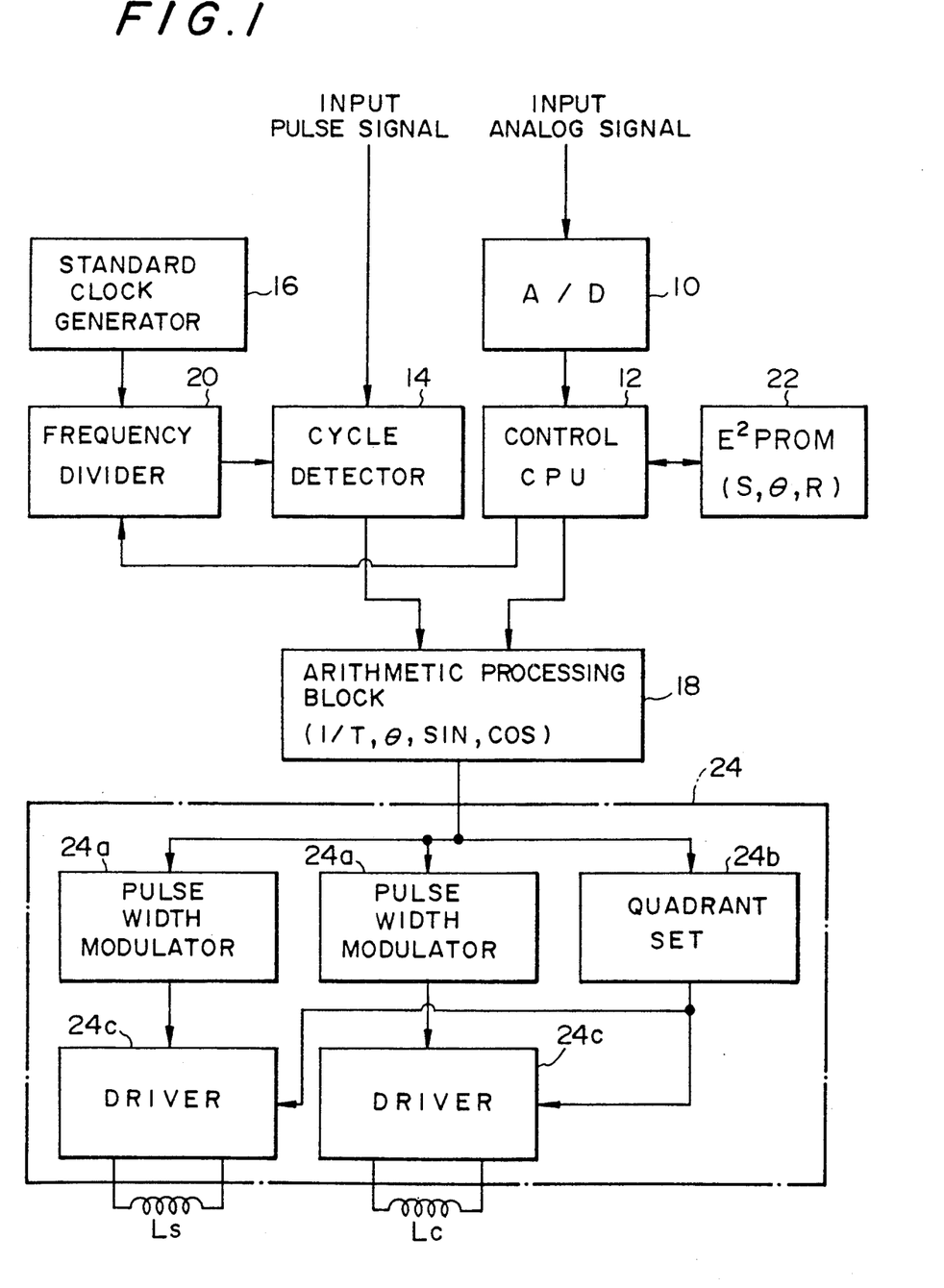
FIG. 1 is a block diagram showing a meter driving device according to the first embodiment of this invention.
Figure 3:
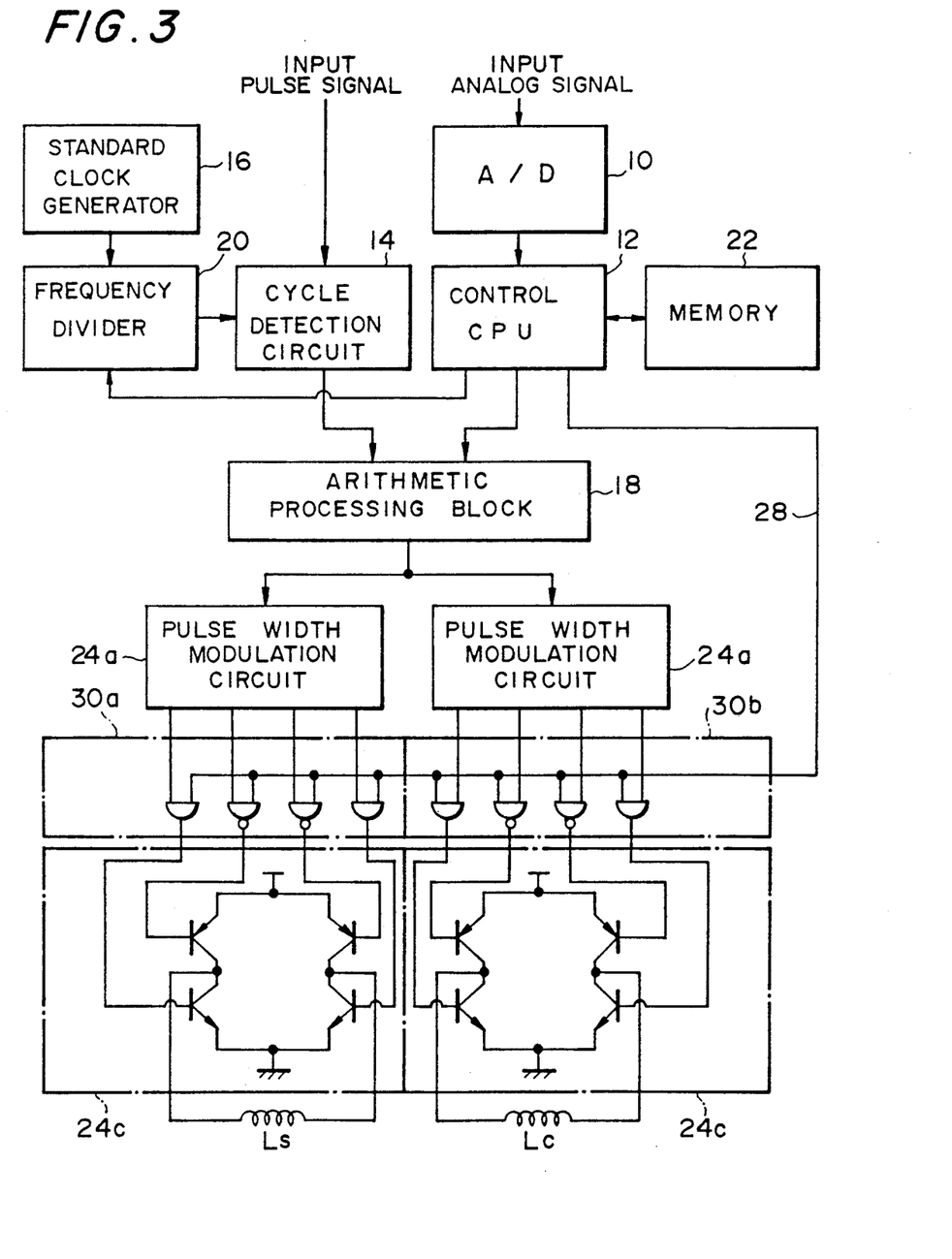
FIG. 3 is a block diagram showing a meter driving device according to the third embodiment of this invention.

The principles of this invention are particularly useful when embodied in a meter driving device, such as shown in FIGS. 1 and 3.

FIG. 1 is a block diagram showing an embodiment of this invention. In general, a speed sensor and a revolution sensor output digital signals with number of pulses corresponding to the number of revolution, while a water temperature sensor and a fuel sensor output analog signals corresponding to the water temperature and the amount of fuel. In this embodiment, the device includes two of signal processing systems for dealing with both the digital and analog signals supplied from such sensors. Namely, when the inputted signal is analog, this signal is supplied to a CPU 12 which converts the analog amount into a binary having 8 bits to control the system, and on the other hand, when the input signal is digital i.e. pulses, it is supplied to the cycle detecting circuit 14.

The cycle detecting circuit 14 also receives basic clock signals from the basic clock signal generator 16 to detect the cycle T of the input pulse signal, and counts the number of pulses in one cycle i.e. within the time period from its pulse rise to the next pulse rise or from pulse fall to the next pulse fall, and latches the counted result in a binary counter of 21 bits. The latched value i.e. the cycle T is then outputted to a calculating process section 18. In the shown embodiment, between the basic clock generator 16 and the cycle detecting circuit 14 there is provided a frequency divider 20 which divides the frquency (2 MHz) of the basic clock signal from the basic clock generator 16 at a suitable division rate depending on the input pulse signal, in response to the instruction from the control CPU 12. The manner for setting the division rate will be mentioned later.

Thus, the analog signal outputted from the A/D converter 10 and control CPU 12, or the pulse signal outputted from the cycle detecting circuit 14, are all inputted to the calculating process section 18 where a variety of calculations like frequency calculation, sin calculation, cos calculation, angular direction $\theta$ calculation, are carried out. These calculations are made by supplying the parameters, previously stored in and read out from the E²PROM 22 which is capable of writing and erasing data, to the calculation process section 18.

Figure 2:
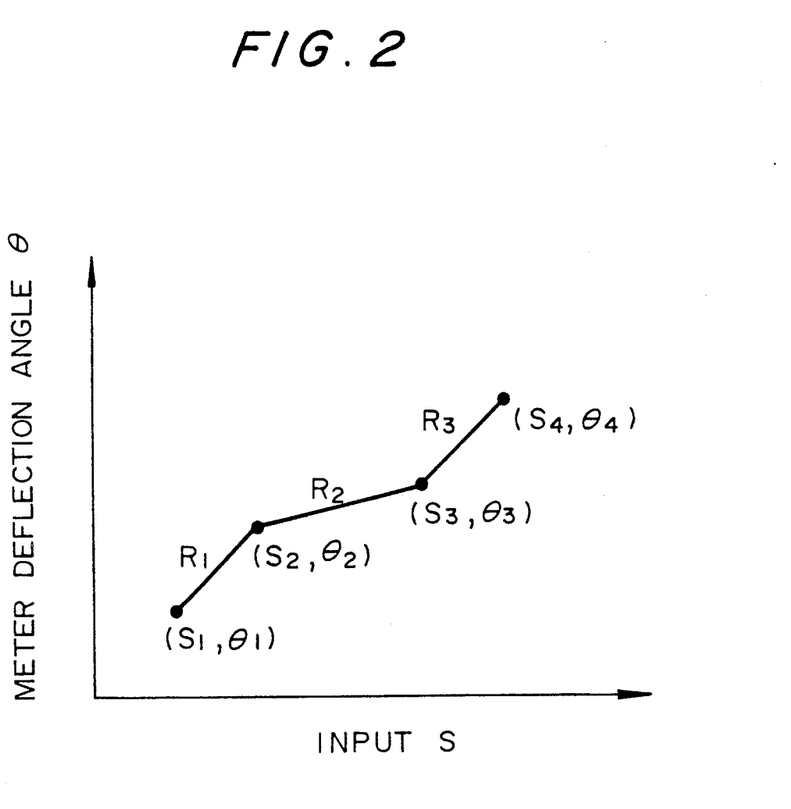
FIG. 2 is a graphic diagram showing a relationship between the input value and the pointer rotation angle in FIG. 1.

For a significant feature of this invention, pointer rotating angles $\theta m$ corresponding to a plurality of predetermined input values Sm (m = 1, 2, 3, ...), and gradients Rm between adjacent two input values Sm and Sm+1 among the input values Sm, are stored in the E²PROM 22 besides the parameters required for the calculation processes mentioned above. The gradient Rm can be calculated by means of a jig or the like, and stored in the E²PROM 22 concurrently with the storing of the parameters. In case of speed meter or tachometer etc. which indicates linearly in response to the input value, two points i.e. the initial point and the ending point can be selected as the input value Sm. On the other hand, in case of non-lineal indication meters such as fuel meter, it can be dealt by setting input values of required number in addition to the initial point and the ending point, as shown in FIG. 2.

Since the parameters are stored in the E²PROM 22 under such formats, the input value Sm, the angular direction $\theta m$, and the gradient Rm are supplied to the calculation process section 18 via the control CPU 12, thereby the angular direction $\theta$ corresponding to the input signal S can be obtained by the aforesaid formula (2), $= \theta m + Rm * (S - Sm)$ where $Sm \leq S < Sm+1$.

Thus obtained angular direction $\theta$ are then served to sin and cos calculations, and thereafter outputted to the driving means 24.

The driving means 24 is composed of: a pair of PWM circuits 24a for both sin type and cos type, which perform PWM on the output signals from the calculation process section 18; a quadrant determination circuit 24b; and a pair of output drivers 24c for directly driving and provided in the same number as the crossed exciting coils Ls and Lc respectively for driving the meter by energizing the coils Ls, Lc with the modulated pulse currents. The quadrant determination circuit 24 determines the codes to be put on the sin and cos. For example, the first quadrant is represented as sin+/cos+, and the second quadrant as sin+/cos−.

In the shown embodiment where a gradient Rm of a previously calculated angular position is stored in the E²PROM 22, it is preferable to store the gradient Rm by the floating-point scale in order not to increase the storage capacity. Specifically, for example, when the number of bits are allocated respectively as: 1 bit to a polarity S; 10 bits to a mantissa D; and 5 bits to an exponent m, thus 16 bits in total, then it becomes possible to establish the gradient R having a wide range as:

$$-1023 \leq R \leq -1023 * 2^{-31} \quad 1023 * 2^{-31} \leq R \leq 1023$$

by expressing the R as $R = (-1)^S * D * 2^{-m}$.

In this manner, the meter driving device according to this invention can calculate the angular direction without requiring division process, resulting in reduced number of components. As described above, in this embodiment the basic clock signal is divided at a suitable division rate corresponding to the input pulse signal, to obtain the frequency of the input pulse signal with high accuracy.

The processes executed in the frequency divider 20 and the cycle detecting circuit 14 will now be described.

Although the cycle detecting circuit 14 counts the number of pulses of the basic clock signal divided by the frequency divider 20 per one cycle of the input pulse signal as stated before, in this embodiment the division rates in the frequency divider 20 are established in four grades as 1, $\frac{1}{2}$, $\frac{1}{4}$, $\frac{1}{8}$ in order to deal with the cases where the maximum frequency fmax differs depending on the types of automobiles as 2 KHz, 1 KHz, 500 KHz, 250 KHz, respectively. These four division rate data are previously stored in the E²PROM 22, and supplied to the frequency divider 20 via the control CPU 12 so as to set: the division rate to 1 i.e. the frequency of the basic clock signal to 2 MHz when the maximum frequency of the input pulse signal is 2 KHz; the division rate to $\frac{1}{2}$ i.e. the frequency of the basic clock signal to 1 MHz when the maximum frequency of the input pulse signal is 1 KHz; the division rate to $\frac{1}{4}$ i.e. the frequency of the basic clock signal to 500 KHz when the maximum frequency of the input pulse signal is 500 KHz; and the division rate to $\frac{1}{8}$ i.e. the frequency of the basic clock signal to 250 KHz when the maximum frequency of the input pulse signal is 250 Hz. These suitably frequency-divided basic clock signals are then supplied to the cycle detecting circuit 14.

The cycle detecting circuit 14 includes a latch counter of 21 bits, which counts the number of pulses of the basic clock signal to detect the cycle T of the input pulse signal.

In the shown embodiment, the frequency division of the basic clock signal depending on the maximum frequency fmax of the input pulse signal enables the device to meet the quantization error requirement of below 1/1000 and to restrict the number of bits in the counter to 21 bits. Namely, on counting the cycle of an input pulse signal having a maximum frequency of 2 KHz, the basic clock frequency is set to 2 MHz (division rate: 1). Therefore, the number of counting required for counting 1 Hz, to meet the meter indication resolution 1/1000, becomes 2,000,000 which is countable by 21 bits. On counting the cycle of an input pulse signal having a maximum frequency of e.g. 1 KHz, since the frequency of the basic clock signal is 1 MHz, the number of counting can be also 2,000,000 countable by 21 bits. Likewise, in case of input pulse signals of 500 Hz, 250 Hz, the basic clock signals become respectively 500 KHz, 250 KHz countable by the same 21 bits without increasing the number of bits.

FIG. 3 is a view similar to FIG. 1, showing a modified apparatus according to another embodiment of this invention. In FIG. 3, the quadrant determination circuit 24b is omitted for simplification. This embodiment differs from the first embodiment in that the driver 24c is composed of combined four switching transistors which are turned ON and OFF to energize the crossed exciting coils Ls and Lc by PWM-modulated currents.

For a significant feature of this embodiment, an output control line 28 is coupled to the control CPU 12, and there are provided logic gate circuits 30a, 30b which judge depending on the output value from the control CPU via the output control line 28 whether to supply the output from the PWM circuit 24a to the driver 24c or not. The logic gate circuits 30a, 30b are composed of a plurality of AND gates and NAND gates to transfer the inputted signals from the output control line 28 and the PWM circuits 24a to the drivers 24c.

Figure 4:
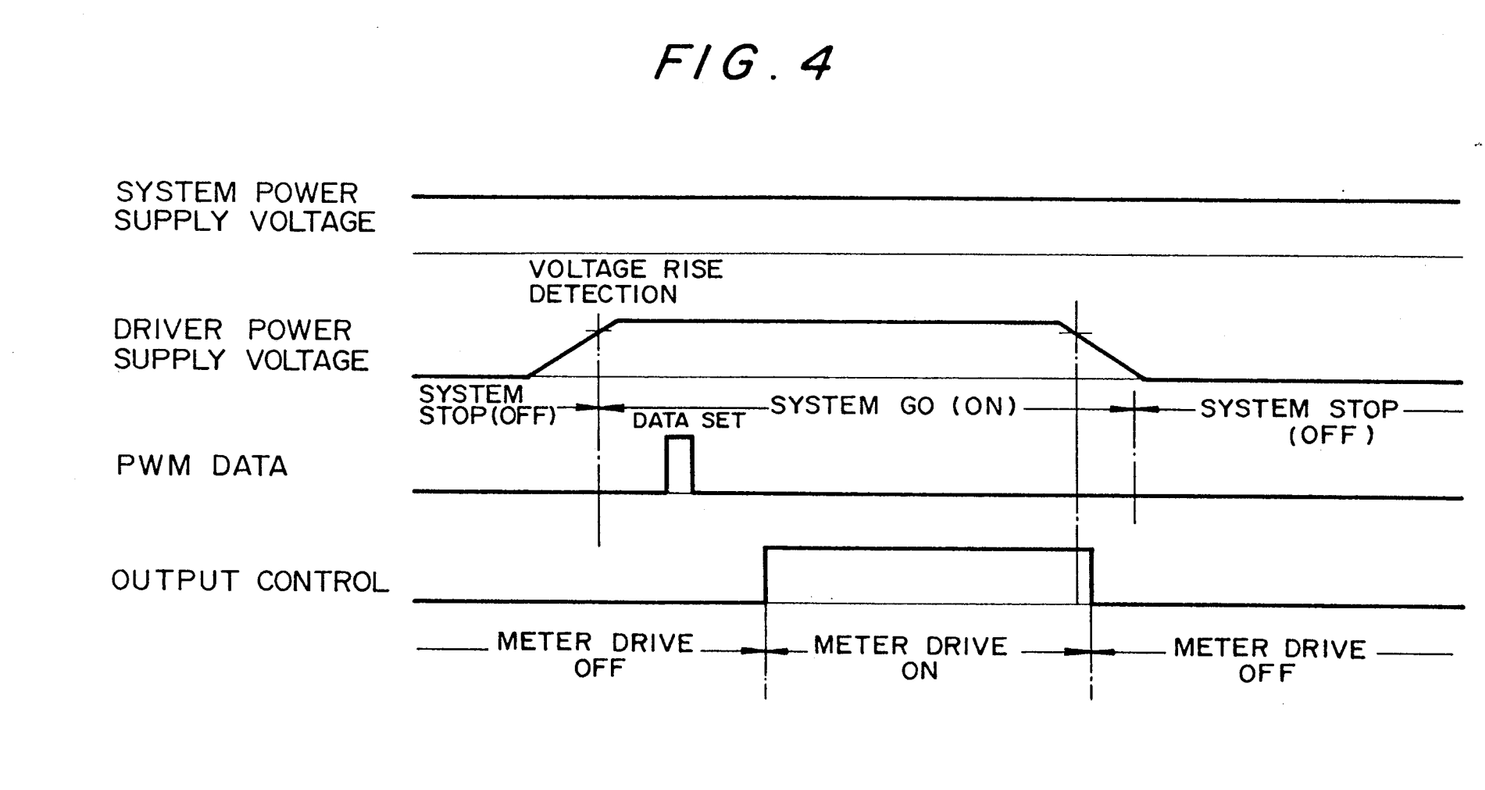
FIG. 4 is a timing diagram of the signals in the third embodiment.

In operation, referring to the timing diagram of FIG. 4, in the OFF state of the ignition switch the basic clock generator 16 is also in OFF state and thus the system and the drivers 24c are out of function, despite the control CPU 12 and the cycle detecting circuit 14 etc. being supplied the power source voltage.

Upon turning ON of the ignition switch, the power source voltage builds up, which is detected by the control CPU 12. The control CPU 12 then oscillates the basic clock generator 16 to start the operation. During such initial setup time period, the control CPU outputs a 0 level signal to the output control line 28 as an indication-inhibiting signal to inhibit the meter indication. As mentioned earlier, since the logic gate circuits 30a, 30b are composed of the AND gates and NAND gates, the ground-side transistors turn OFF and the crossed exciting coils Ls, Lc are not energized thereby putting OFF the meter when the output control line 28 is at 0 level.

The control CPU 12, having been inputted detection signals from the sensor and having completed sin and cos calculations sets the calculation result data in the PWM circuits 24a after expiration of predetermined time, and then outputs 1 level signal as an indication-authorizing signal to the output control line 28. The logic gate circuits 30a, 30b, depending on the signals from the PWM circuits 24a, supply the 1 level signal to the drivers 24c which energizes the crossed exciting coils Ls, Lc to drive the meter.

At the turning OFF of the ignition switch, the power source voltage on the drivers 24c lower and comes out of normal operation. But the control CPU 12 can detect this voltage down and outputs again the 0 level signal to the output control line 28 to turn OFF the meter driving, thereby avoiding malfunctional output.

Thus, according to this embodiment, there are additionally provided the output control line 28 and the logic gate circuits 30a, 30b composed of a plurality of AND gates and NAND gates for making output-authorization or output-inhibition according to the 0 level or 1 level digital signals. When the power source to the drivers 24c turn ON, the control CPU 12 inhibits, via the output control line 28, the logic gate circuits 30a, 30b from outputting until complete data is set in the PWM circuits 24a. And when they turn OFF, upon the voltage on the drivers 24c lowers below the level of normal operation, the control CPU 12 inhibits the outputting. In this manner, by cutting the signal supply to the drivers at the time of turning ON and OFF of the power source, any abnormal output of the meter can be eliminated.

As described above, this embodiment enables to prevent the meter from abnormal indication at the turning ON and OFF of the power source, thereby realizing meter indication with high reliability.

What is claimed is:

1. A meter driving device for driving a cross coil meter which indicates angular directions corresponding to input values, comprising:
    (a) a clock generating means for generating basic clock signals;
    (b) a frequency calculating means for calculating input pulse signal frequency which provides the input value for indicating the angular direction;
    (c) a memory means for memorizing, as parameters, a plurality of input values Sm (m=1, 2, ...), angular directions $\theta m$ corresponding to the input values Sm, and coefficients Rm representative of the grades of the change in angular direction depending on the change between adjacent two input values Sm and Sm+1 among the plurality of input values;
    (d) a calculating means for calculating the angular direction corresponding to the input value, on the basis of the input pulse signal frequency obtained by said frequency calculating means and of the parameters read out from said memory means, and for outputting an angular direction signal;
    (e) a driving means, having a power source, for energizing a first and a second mutually crossed coils based on the outputted angular direction signal.

2. A meter driving device according to claim 1, wherein said calculating means executes the calculation by the formula noted below to obtain an angular direction $\theta$, based on the input pulse signal frequency S obtained by said frequency calculating means, and outputs sin $\theta$ or cos $\theta$ as an angular direction signal:

$$= \theta m + Rm^*(S - Sm)$$

where $Sm \leq S < Sm + 1$.

3. A meter driving device according to claim 2, wherein said frequency calculating means further comprising:
    (i) a frequency divider for dividing the frequency of the basic clock signal from said clock generating means;
    (ii) a cycle detecting circuit for counting the number of the basic clock signal pulses per cycle of the input pulse signal.

4. A meter driving device according to claim 3, wherein said frequency divider divides the basic clock signal frequency at a frequency-division rate corresponding to the minimum cycle of the input pulse signal.

5. A meter driving device according to claim 4, wherein said driving means further comprising:
    (i) a PWM (pulse width modulation) circuit for PWM-modulating the angular direction signal from said calculating means;
    (ii) a first and a second drivers for applying the PWM-modulated angular direction signals to the first and second exiciting coils respectively.

6. A meter driving device according to claim 1, wherein said meter driving device further comprising:
    (i) an output control means for outputting an indication-authorizing signal or an indication-inhibiting signal upon expiring a predetermined time period from when the power source of said driving means turned ON or OFF respectively;
    (ii) logic gate means for supplying the angular direction signal to said driving means only when the output from said output control means is the indication-authorized signal.

* * * * *